United States Patent [19]

Brodsky et al.

[11] Patent Number: 5,673,177
[45] Date of Patent: Sep. 30, 1997

[54] HEAT SINK STRUCTURE WITH CORRUGATED WOUND WIRE HEAT CONDUCTIVE ELEMENTS

[75] Inventors: William Louis Brodsky, Binghamton; Glenn Lee Kehley, Endicott; Sanjeev Balwant Sathe, Johnson City, all of N.Y.

[73] Assignee: International Business Machines Corporation, Armonk, N.Y.

[21] Appl. No.: 509,915

[22] Filed: Aug. 1, 1995

[51] Int. Cl.$^6$ ...................................................... H05K 7/20
[52] U.S. Cl. .................. 361/704; 29/890.03; 165/80.3; 165/185; 174/16.3; 257/707; 257/713; 361/690; 361/707
[58] Field of Search ..................... 29/432, 727, 890.03; 165/80.2, 80.3, 185; 174/16.3; 257/706–707, 712, 713, 718, 719, 726, 727; 361/690, 695, 697, 703–704, 707, 709–710, 717–718, 722

[56] References Cited

U.S. PATENT DOCUMENTS

| | | | |
|---|---|---|---|
| 4,270,604 | 6/1981 | Nakamura | 165/185 |
| 4,421,161 | 12/1983 | Romania et al. | 165/80 |
| 4,483,389 | 11/1984 | Balderes et al. | 165/80 B |
| 4,535,841 | 8/1985 | Kok | 165/185 |
| 4,546,405 | 10/1985 | Hultmark et al. | 361/386 |
| 4,612,601 | 9/1986 | Watari | 361/387 |
| 4,733,453 | 3/1988 | Jacoby | 29/432 |
| 4,765,400 | 8/1988 | Chu et al. | 165/185 |
| 4,821,389 | 4/1989 | Nelson | 29/157.3 R |
| 4,899,210 | 2/1990 | Lorensetti et al. | 357/81 |
| 5,022,462 | 6/1991 | Flint et al. | 165/80.4 |
| 5,107,575 | 4/1992 | Ishida et al. | 29/89.048 |
| 5,154,679 | 10/1992 | Fuller et al. | 29/890.047 |
| 5,158,136 | 10/1992 | Azar | 165/185 |
| 5,299,090 | 3/1994 | Brady et al. | 361/703 |
| 5,358,072 | 10/1994 | Arai et al. | 361/690 |
| 5,369,301 | 11/1994 | Hayashi et al. | 257/722 |
| 5,375,655 | 12/1994 | Lee | 165/185 |
| 5,473,508 | 12/1995 | Porter et al. | 361/695 |
| 5,499,450 | 3/1996 | Jacoby | 165/185 |

OTHER PUBLICATIONS

"High Performance Air Cooling for LSIS Utilizing a Pin–Fin Heat Sink", ASME Winter Annual Meeting, Nov. 1992, Minakami et al., pp. 1–6.

"Air Jet Impingement on a Minature Pin–Fin Heat Sink", ASME Winter Annual Meeting, Nov. 1992, B. W. Bartilson, pp. 1–8.

*Primary Examiner*—Gregory D. Thompson
*Attorney, Agent, or Firm*—Lawrence R. Fraley

[57] ABSTRACT

A heat sink structure with a heat-conducting base and wound wire heat conductors thermally attached to the base for use in electronic packaging structures, e.g., those used in computers. The method of making such a structure, as taught herein, provides a unique structure using wire to form the thermally conductive members in a corrugated shape and aligning these with and thermally coupling to a base structure. In one embodiment, the base structure may be excluded with a heat conductive spacer member used instead.

61 Claims, 7 Drawing Sheets

HEAT SINK STRUCTURE WITH CORRUGATED WOUND WIRE HEAT CONDUCTIVE ELEMENTS

TECHNICAL FIELD

This invention relates to heat sink structures and particularly to such structures which can be used as part of electronic packaging assemblies.

BACKGROUND OF THE INVENTION

Various examples of heat sinks, including those used in electronic packaging, are known in the art. The following are representative examples: 1) U.S. Pat. No. 5,369,301 (Hayashi, et. al.) and U.S. Pat. No. 4,733,453 (Jacoby) both discuss methods and parameters for cold forming heat sinks of the pinned type; 2) U.S. Pat. No. 5,107,575 (Ishida, et. al.) describes a method of fabricating wirelike structures into a dissolvable carrier member, forming the resulting carrier with wirelike members, assembling this to a surface from which heat is to be conducted, and removing the carrier to provide fluid passages therein; and 3) U.S. Pat. No. 5,158,136 (Azar) describes ducting of air flow through a pinned heat sink to improve thermal performance. The following are further examples: U.S. Pat. No. 5,154,679 (Fuller); U.S. Pat. No. 5,022,462 (Flint, et al. ); U.S. Pat. No. 4,764,400 (Chu, et al.); U.S. Pat. No. 4,535,841 (Kok); U.S. Pat. No. 5,299,090 (Brady, et al.); U.S. Pat. No. 4,899,210 (Lorenzetti, et al.); U.S. Pat. No. 4,612,601 (Watari); U.S. Pat. No. 4,546,405 (Hultmark, et al.); U.S. Pat. No. 4,483,389 (Nelson); and U.S. Pat. No. 4,721,161 (Romania, et al.).

Technical papers describing heat sink approaches include "High Performance Air Cooling for LSIS Utilizing a Pin-Fin Heat Sink" by Minakami, et. al. in the proceedings of the ASME Winter Meeting 1992 and "Air Jet Impingement on a Miniature Pin-Fin Heat Sink" by Bartilson in the proceeding of the ASME Winter Meeting 1991.

Typically, there are limitations for the aspect ratio (i.e. pin length to pin diameter ratio), pin spacing, pin locations, or combinations of these parameters for pinned heat sinks. There are also other physical and economical limitations. For forged heat sinks, there are limitations on the aspect ratio and pin spacings that can be produced. For heat sinks made by etching, there are economic limitations as to how much material can be satisfactorily removed. For extruded and then machined pinned heat sinks, there are physical limitations on aspect ratio and spacing for both the extruding and machining processes. For other wound wire techniques there are limitations on changing pin spacing and aspect ratio within a heat sink.

DISCLOSURE OF THE INVENTION

It is, therefore, a primary object of the present invention to enhance the art of heat sinks and particularly that portion of the art involving wirelike heat sink structures for electronic packaging.

It is another object of this invention to provide a heat sink structure where the wirelike elements are in a high density configuration with variable spacing and heights. Another object is to provide an effective, facile method of producing such structures.

In accordance with one aspect of this invention, there is provided a method of making a heat sink structure comprising the steps of providing a heat-conducting base member, forming a first substantially planar corrugated wound wire heat conductive element from a wire, locating a spacer member against the first wound wire heat conductive element, forming a second corrugated wound wire heat conductive element from a wire, positioning said second corrugated wound wire heat conductive element against the spacer member, and positioning both said first and second corrugated wound wire heat conductive elements on the heat-conducting base member in a thermally conductive manner.

In accordance with another aspect of this invention, there is provided a method of making a heat sink structure comprising providing a heat-conducting base member having a plurality of slots, forming a first corrugated wound wire heat conductive element from a wire, forming a second corrugated wound wire heat conductive element from a wire, and positioning the first and second corrugated wound wire heat conductive elements within respective slots in the heat-conducting base member such that these elements are thermally coupled to the base member.

In accordance with yet another aspect of this invention, there is provided a method of making a heat sink structure comprising forming a first corrugated wound wire heat conductive element from a wire, locating at least one heat conductive spacer member against the first wound wire heat conductive element in a thermally conductive manner, forming a second corrugated wound wire heat conductive element from a wire, and positioning the second corrugated wound wire heat conductive element against the spacer member in a thermally conductive manner.

In accordance with a further aspect of this invention, there is provided a heat sink structure comprising a heat-conducting base member including a plurality of parallel slots, a plurality of corrugated wound wire heat conductive elements each formed from a wire, the wire heat conductive elements being positioned in a side-by-side, spaced-apart relationship so as to permit fluid flow through the elements in at least two directions, the heat conductive elements including a series of curved end portions positioned within slots in the base member in a thermally conductive manner.

In accordance with a still further aspect of this invention, there is provided a heat sink structure comprising a plurality of corrugated wound wire heat conductive elements each formed from a wire, these heat conductive elements being positioned in a side-by-side, substantially parallel, spaced-apart relationship so as to permit fluid flow through the elements in at least two different directions, and at least one thermally conductive spacer for providing the spacing between respective pairs of the heat conductive wound wire heat conductive elements. Each wire conductive element includes a series of curved end portions positioned against said thermally conductive spacer in a thermally conductive manner.

In accordance with another aspect of this invention, there is provided an electronic apparatus comprising an electronic device having at least one thermally conductive surface, and a heat sink structure including corrugated wound wire heat conductive elements thermally joined to at least one planar heat conducting base member. The electronic device is joined to the heat sink in a thermally conductive manner along a thermally conductive surface of said electronic device.

In accordance with still another aspect of this invention, there is provided an electronic apparatus comprising an electronic device having at least one thermally conductive surface and a heat sink structure including a plurality of wound wire heat conductive elements and at least one heat conducting spacer member, the wound wire conductive elements being thermally joined to the heat conducting spacer member, the electronic device being joined to the wound wire heat conductive elements and heat conducting spacer member in a thermally conductive manner along the electronic device's thermally conductive surface.

BEST MODE FOR CARRYING OUT THE INVENTION

For a better understanding of the present invention, together with other and further objects, advantages, and capabilities thereof, reference is made to the following disclosure and appended claims in connection with the above-described drawings.

Figure 1:
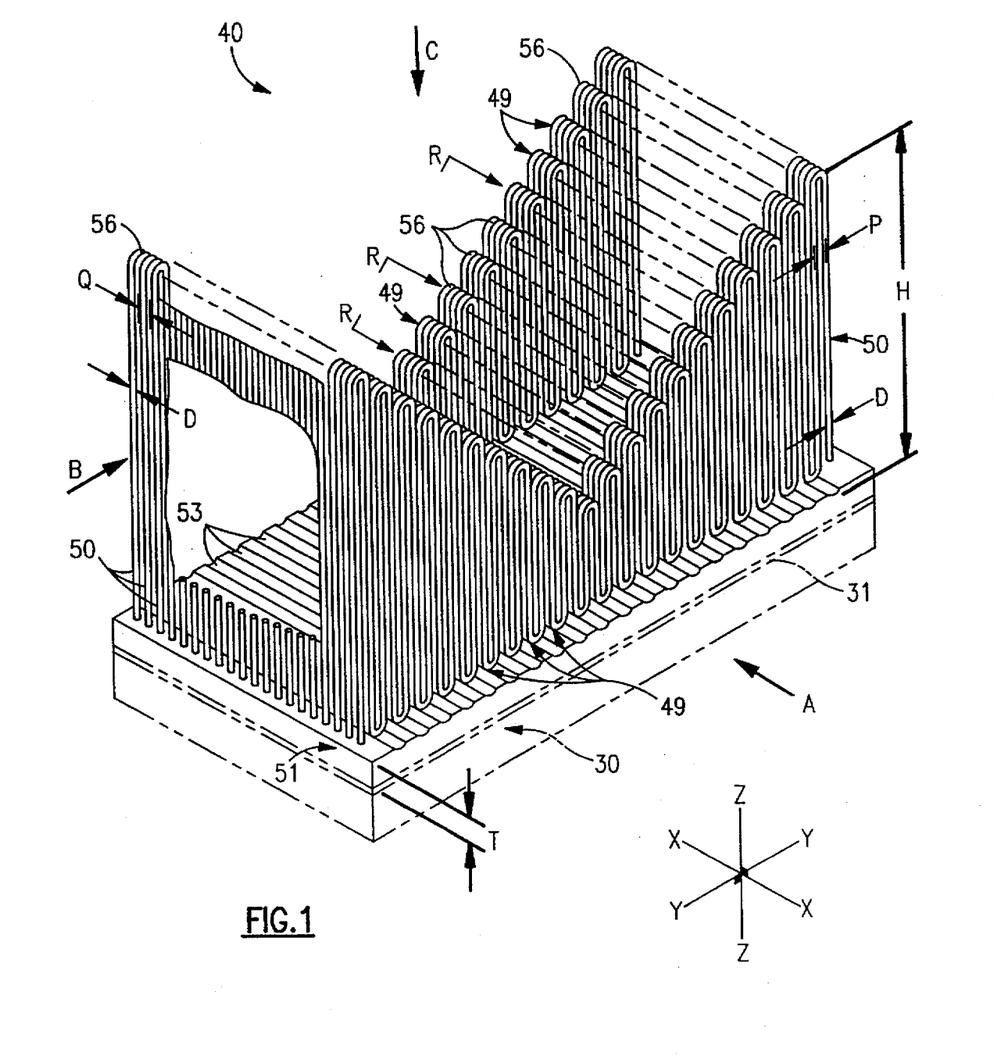
FIG. 1. is a perspective view of a heat sink structure, as assembled, in accordance with one embodiment of the invention.

In FIG. 1, there is shown a heat sink structure 40 in accordance with a preferred embodiment of the invention. By the term heat sink structure as used herein is meant a structure capable of enhancing heat transfer from a device 30 to a fluid (i.e. liquid or gas) flowing in directions A, B or C (in FIG. 1, A, B and C are along the X, Y and Z coordinates, respectively for structure 40) or any combination thereof. By the term device as used herein is meant an electronic device such as a semiconductor chip, single chip module, or even a multi-chip module as used in electronic systems commonly known as computers. A single or multichip module may comprise a substrate of ceramic or other insulating material having electrically conductive circuits, semiconductor chip(s), electrical connections between chip (s) and substrate, cap or heat spreading cover, and a thermally conductive grease between the chip(s) and heat spreading member. It is desired to increase the heat transfer from said device within a minimum volume while maintaining a minimum temperature rise of the device. As the operating temperature of an electronic device decreases, the reliability and life expectancy increases as is known in the art. In semiconductor devices it is desirable to maintain a junction temperature of approximately 45 to 85 degrees Celsius (°C.), with cooling fluids having an inlet temperature of approximately 20° to 45° C. This invention is especially intended (albeit not limited) for use in applications where heat transfer densities (e.g. thermal fluxes) of approximately 15 to 60 watts/square inch occur at the interface between the device and heat-conducting member. The interface between the device and heat conducting member of such structures typically possesses a cross-sectional area in the range of approximately 0.16 to 25 square inches.

In the design of heat sinks for cooling of electronic components, two design parameters are of importance: (1) thermal flux; and (2) pressure drop of the cooling fluid. For a given size heat sink and cooling fluid inlet temperature, an increase in thermal flux provides a reduced device operating temperature resulting in increased device reliability and life expectancy. Reduction of coolant fluid pressure drop within a heat sink allows a larger mass flow of such fluid, potentially increasing the thermal transfer rate. This potentially provides a reduced device operating temperature with resulting improvements in device operation. It is known in the art that, for a given heat sink size, pressure drop, and fluid flow rate, reduction of wire diameter can result in an increase in the heat sink's thermal performance.

The heat sink of the present invention includes a plurality of substantially planar corrugated wound wire heat conductive elements 50 arranged in the structure in accordance with optimum wound wire diameters (D), horizontal spacing individual pitches (P, Q) and wire heights (H). Reduction in wire diameter D for wound wire heat conductive elements 50, in conjunction with reduction of wire to wire pitches P and Q (e.g., centerline to centerline distance between adjacent wires) results in a corresponding increase in thermal heat transfer rate (e.g., 10 to 25 percent). Similarly, a reduction in fluid pressure drop can be obtained by offsetting the wound wire elements 50 (e.g., by one-half of pitch P), commonly called a staggered grid (not shown). Providing additional wound wire elements 50 in available space created by reducing the wound wire diameter and pitches P and Q, even further results in improved thermal performance (e.g., approximately 5 to 10 percent). Still further, altering the height of respective wound wire elements (e.g., longitudinally (direction B) as in FIG. 1, or both laterally (direction A) and longitudinally in FIG. 2A, the shorter wire elements seen through aperture 45 in the upper member 51") provides thermal heat sinking improvement for the invention. The upper surfaces 56 of the upper curved ends 49 of wound wire elements 50 in each row (R, a total of 21 shown in FIG. 1) may lie planar and/or parallel to the heat conducting base member 51.

This invention is preferably intended for applications where the wound wire elements 50 have a diameter of approximately 0.4 millimeters (mm) to 2.5 mm, are made from copper, aluminum or the like sound heat conducting material, and have a height (H) of approximately five to one hundred times the wire diameter (D). The base 51 is preferably of copper or similar sound heat conducting material.

Thus, there has been shown in FIG. 1, a heat sink structure 40 adapted for being positioned on the top of a substantially planar thermally conducting surface of device 30. Thermally conducting material 31 (e.g., a thermal adhesive or grease) has been positioned to enhance the thermal conduction from device 30 to base member 51 of structure 40. Within base member 51 is a plurality of elongated grooves (slots) 53 in which a plurality of the corrugated wound wire elements 50 are spacedly located having a centerline-to-centerline pitch (spacing) Q. Each wound wire element 50 is comprised of a substantially singular wire having a plurality of curved end portions 49, with the substantially parallel sections of each element spaced with a centerline-to-centerline pitch P. Preferably, the lateral slots 53 are spaced apart with a centerline-to-centerline distance of about twice the P dimension. The lower curved end portions 49 of wound wire elements 50 are located in a planar fashion and are fixedly secured in slots 53 of heat conducting base member 51 by soldering, brazing, or the like processes, leaving material 52. The upper curved end portions 49 form the planar surface 56 in the lateral direction, which, as described, is preferably parallel to base member 51 in the width (or lateral) dimension, but which may form a complex geometric shape, or may form other configurations as desired in the length (longitudinal) dimension (a substantially V-shaped structure shown in FIG. 1 in the length dimension).

The thermal conductivity of the thermally conductive grease or adhesive 31 between device 30 and base 51 is preferably in the range of approximately 0.5 watts per meter-degree Kelvin to 12 watts per meter-degree Kelvin, this material preferably having a thickness of approximately 0.002 to 0.015 inches.

Figure 1A:
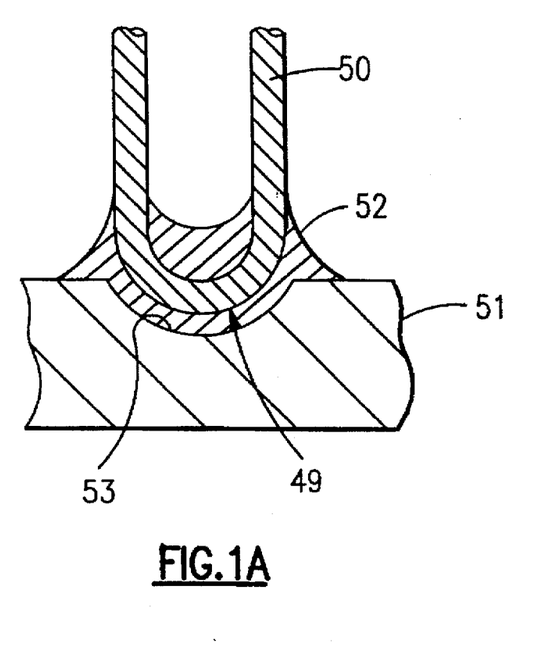
FIG. 1A. is a partial section of FIG. 1 on an enlarged scale.
Figure 1B:
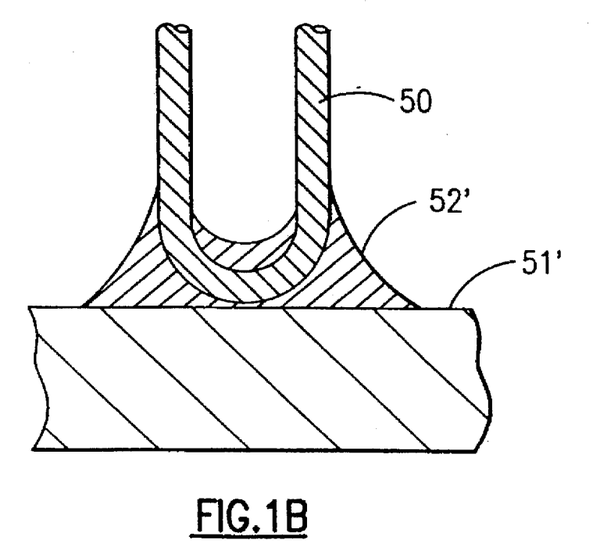
FIG. 1B. is an alternative embodiment of a construction as shown in FIG. 1A.

FIGS. 1A and 1B, showing two embodiments of the invention, are enlarged views of the thermal joint between the wound wire members 50 and heat conducting base 51. In FIG. 1A, base 51 is thermally joined to the curved end portion 49 of wound wire elements 50 which is located in lateral slots 53 in a fixedly and thermally conductive manner using solder, copper brazing, or like material 52. In FIG. 1B, base 51' is thermally joined to curved end portions 49 of wound wire elements 50 by fixedly and thermally securing portions 49 to the top surface of base member 51 in a conductive manner using solder, brazing, or like material 52'. Portions 49 thereby are seated within slots 53 in FIG. 1A but are merely positioned atop the planar surface of base 51' in FIG. 1B.

Figure 2:
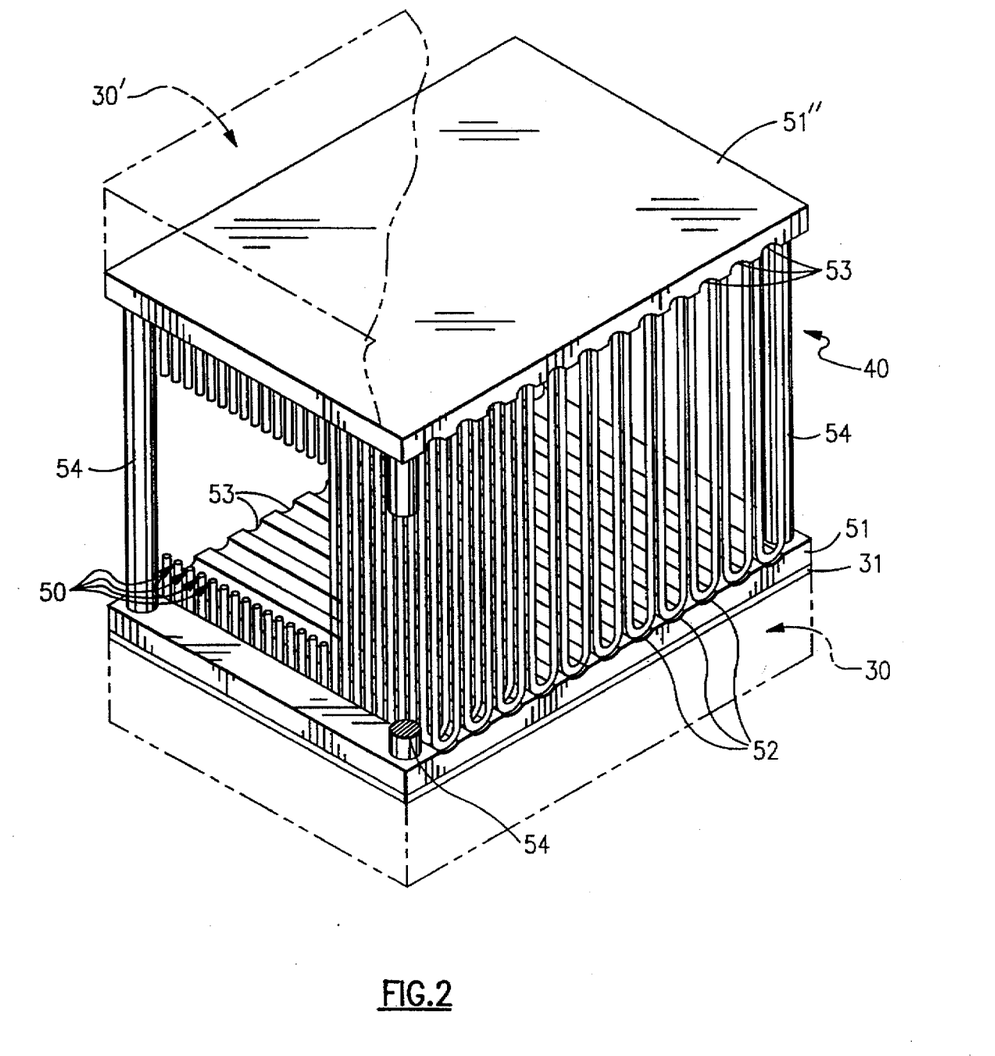
FIG. 2. is the perspective view of a heat sink structure, as assembled, in accordance with a second embodiment of the invention wherein a second heat-conducting base element is placed on top of the invention's corrugated wound wire heat conductive elements.
Figure 2A:
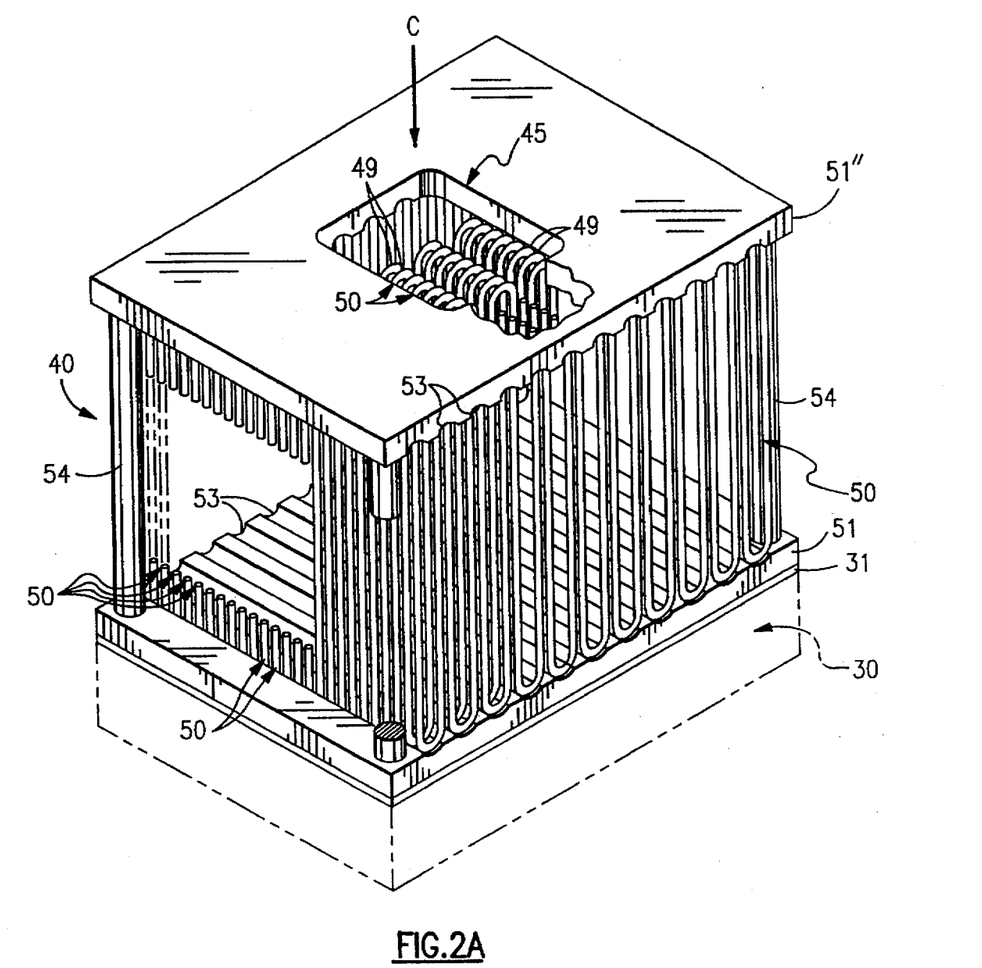
FIG. 2A. is a perspective view of the heat sink structure of FIG. 2 with an aperture formed in the second base element.

In FIGS. 2 and 2A, heat sinks with wound wire elements 50 as shown in FIG. 1 are shown with the addition of a second heat conducting base 51" thermally secured to the upper curved (looped) ends 49 of the corrugated wound wire members 50, allowing a second device 30' (partly seen in phantom in FIG. 2) to be mounted on this surface. Base 51" also provides a fluid baffle at upper surfaces 56. Support posts 54 (four total) provide structural integrity to resist internal and/or externally generated forces on the heat sink. Examples of mechanisms that produce internally generated forces include thermal gradients within the heat sink, differences in thermal coefficients of expansion, weight of members and elements, etc. Examples of externally generated forces include direct force application, inertial loading during shipping, handling, machine operation, etc. The support posts 54, base 51, and second base 51" can be combined into a single structure, such as a four sided structure with open ends, that provides these aforementioned functions and provides a fluid conduit or duct capable of having fluid pass therethrough in at least two directions.

In FIG. 2A, aperture 45 may be provided in second base 51" to provide an alternative cooling fluid passage (to allow fluid passage in direction C, or perpendicularly to the planar surface of base 51"). Visible through aperture 45 are wound wire members 50 having individual curved end portions (loops) 49 of reduced height, being located at a different (lesser) height H from the remaining, longer curved end portions 49 (either cut or blocked from view). These loops allow the formation of a plenum-like structure for fluid flowing in direction C through aperture 45. Base 51" may also be used to support a fan over aperture 45, creating a positive or negative pressure in the lower plenum-like structure.

Bases 51, 51' and 51" are preferably made of copper and may have a thickness (T, FIG. 1) of 1.0 to 5.0 mm. Bases 51, 51' and 51" may also be of a curved, tapered, stepped or other geometric shape to enhance thermal or mechanical requirements for the heat sink structure 40, and are thus not required to be of uniform thickness (excluding slots 53) throughout.

Figure 3:
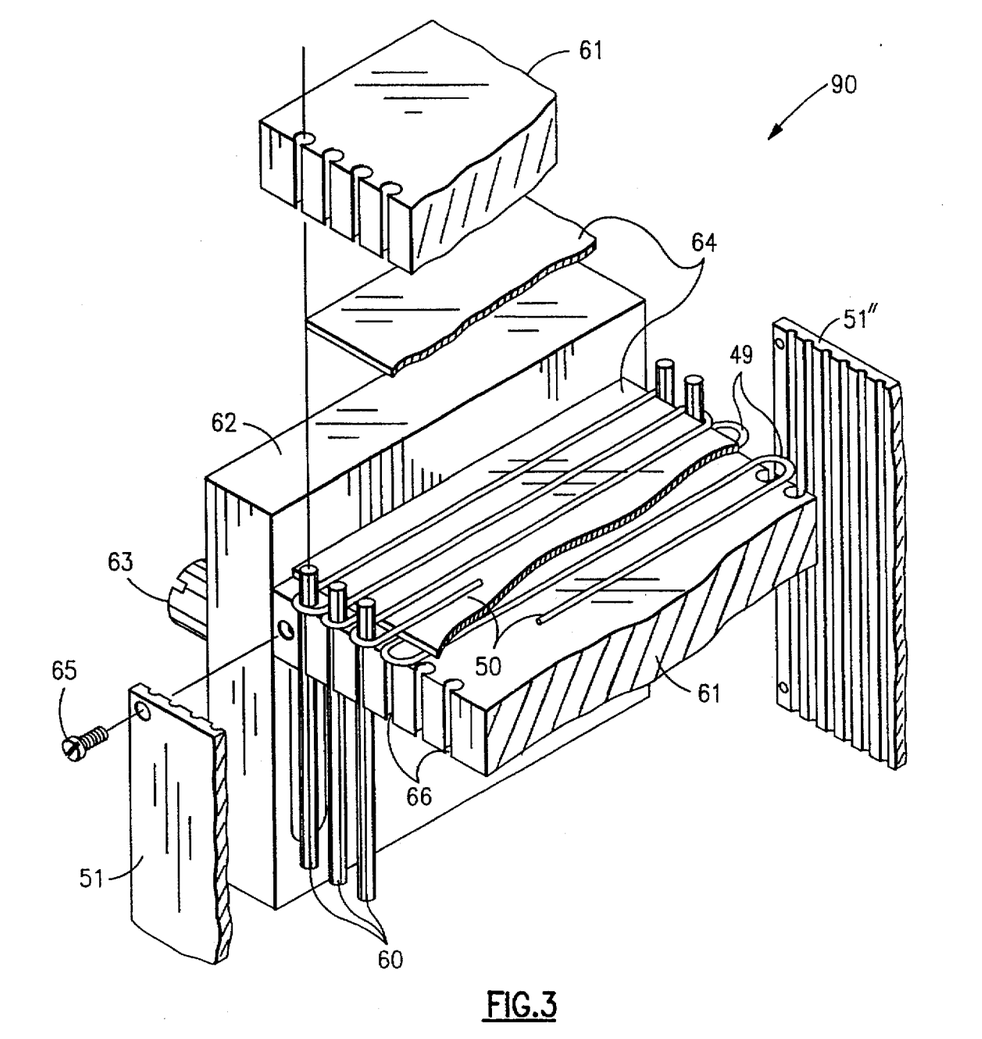
FIG. 3. is a perspective view of one embodiment of a fixture that can be used in the winding of corrugated wound wire heat conductive elements, spacing of same, and aligning same relative to heat-conducting base member(s) for use in a heat sink structure of the type defined herein.

In FIG. 3, showing a perspective view of an assembly fixture 90, the wound wires 50 are formed substantially about spacedly positioned rodlike members (rods) 60. Rods 60 are slidably located in end slots 66, which are spacedly located in spacing elements 61. Elements 61 in turn are supported by end slides 62 using screws 63. In use, the wirelike material for wound wire members 50 is formed around rods 60 in a corrugated fashion, forming curved end portions 49 at the opposing ends thereof. A substantially planar spacer 64 is then placed against wound wire element 50, rods 60 are advanced, and another wound wire element is formed around rods 60. This is continued until the correct number of layers have been formed. The purpose of advancing rods 60 is to minimize the amount of rod over which the wire element 50 must be maneuvered. Heat conducting base member(s) 51 and/or 51" are then assembled to the curved end portions 49 and fastened in place with fastener(s) 65. Wound wire elements 50 are then thermally joined to the heat conducting base member(s) 51, 51' or 51" using a soldering or brazing process known in the art. Rods 60, end slides 62, spacing elements 61 and planar spacers 64 are removed leaving a heat sink structure as shown in FIGS. 1, 2, or 2A.

Rods 60 are not limited to a single or planar array. As shown in FIG. 1, surfaces 56 form a substantially V-shaped configuration, requiring two opposed planar arrays of rods 60. These surfaces may assume many different configurations, including stepped, curved, etc., depending on the operational requirements of the invention. In FIG. 2A, a third array of rods 60 would be added to form the internally shown, curved end portions 49 for those wire elements seen through opening 45. The other portions 49 would be formed similarly as in FIG. 3. A multitude of geometries are thus possible with this invention.

In one example, a heat sink fabricated using the aforedefined method included a total of 19 wound wire elements 50 each having a total of 68 opposed curved end portions 49 for each element (a total of 34 lateral slots were used in members 51 and 51"). The curved end portions are arranged in a staggered fashion from one wound element 50 to the next, resulting in lateral grooves 53 having a centerline-to-centerline spacing equal to P (FIG. 1). The heat sink was constructed as in FIG. 2, having base member 51 and 51". The wound wire elements included a diameter (D) of about 0.5 millimeters (mm) with pitches P and Q both of about 1 mm. Significantly, all elements 50 were wound from a single continuous wire using the fixture as shown in FIG. 3. Having pitches P and Q of about 1 mm assures a wire density of about 1 wire per square millimeter, with the preferred range of about 0.155 to 1.6 wires per square millimeter. Elements 50 are individually joined in a thermally conductive manner to bases 51 and 51" (these each having a thickness (T) of about 2.5 mm), with solder paste such as type R244NC from the Litton Company, Des Plaines, Ill. The solder paste is applied to bases 51 and 51", then corrugated wound wires 50 (still located in assembly fixture 90) are aligned to the lower base 51. The assembly is then positioned on a conventional laboratory hot plate, the solder paste reflowed, base 51" aligned, and the solder paste provided for base 51" reflowed. An overall heat sink height of 25 mm provides a height (H)

to wire diameter (D) aspect ratio of 50:1. Support posts 54 may be positioned within provided holes (not seen) within lower base 51 following wire placement therein. Posts 54 would then align with corresponding holes (not seen) in top base 51".

A heat sink similar to FIG. 2 was constructed wherein instead of wound wire elements 50, bases 51 and 51' had apertures for each wire segment. Individual wires were assembled in each pair of apertures and soldered as previously described. This heat sink had pitch diameters P and Q of 1 mm and used wires having diameters D of 0.5 mm. The height of this heat sink was also 25 mm.

Figure 4:
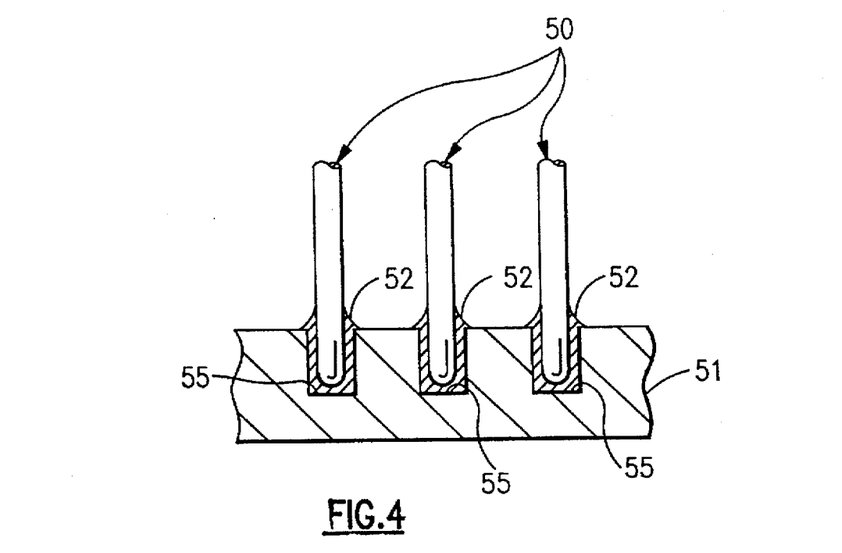
FIG. 4. is a partial, much enlarged view of an alternative embodiment of the invention.

Alternately, the curved end portions 49 of wound wire elements 50 formed as previously described can be inserted within substantially parallel longitudinal slots 55 in base 51, as shown in FIG. 4, thus forming planar arrays of wire elements which are then thermally joined to base 51 (e.g., using solder, brazing, or like material 52 as described above). The thermal joining of wound wire elements 50 and base 51 may also be accomplished using a press fit connection, thereby assuring metal to metal contact. A second base 51" could be added as previously discussed, this second base 51" also possibly containing longitudinal slots 55 if desired. Slots 55 thereby provide lateral spacing for the elements 50.

Figure 5:
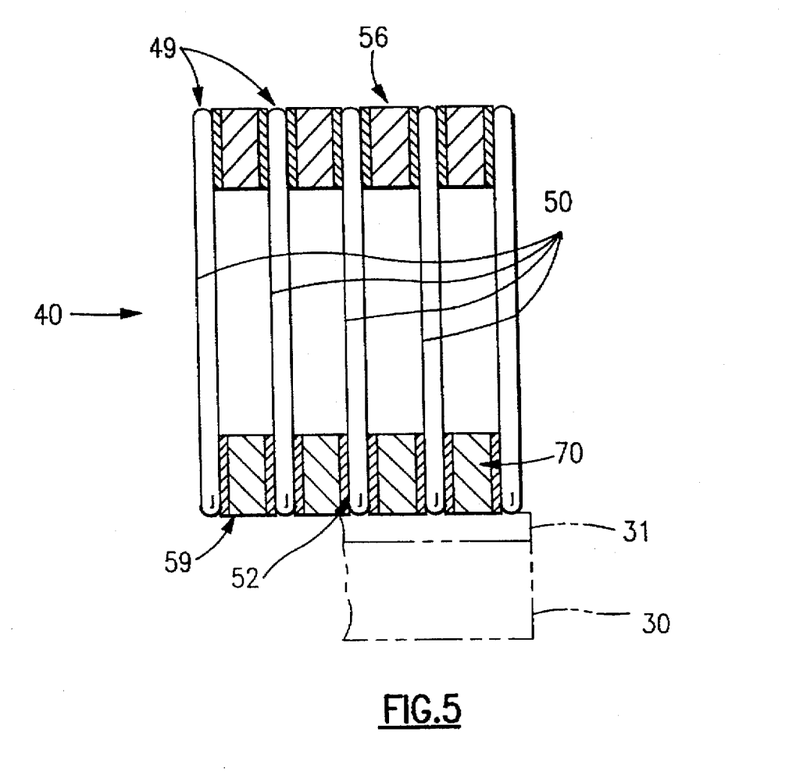
FIG. 5. is a side elevational view of yet another embodiment of the invention.

In FIG. 5, a sectional view of a heat sink having a substantially planar heat conducting spacer 70 is shown, spacer 70 placed against wound wire elements 50 and thermally joined to the rounded ends 49 of wires 50 using solder, brazing, or the like materials. Wound wire elements 50 have been formed on rodlike members 60 as previously described. The bottom surfaces 59 may be finished by milling, grinding, and/or polishing. A smooth surface is desired when using some high conductivity thermal greases (to reduce drying of the grease by capillary action of its wetting agent). Each spacer 70 can be of a rectangular configuration (e.g., the top and bottom sides shown in FIG. 5) or any other (e.g., round) configuration.

Figure 6:
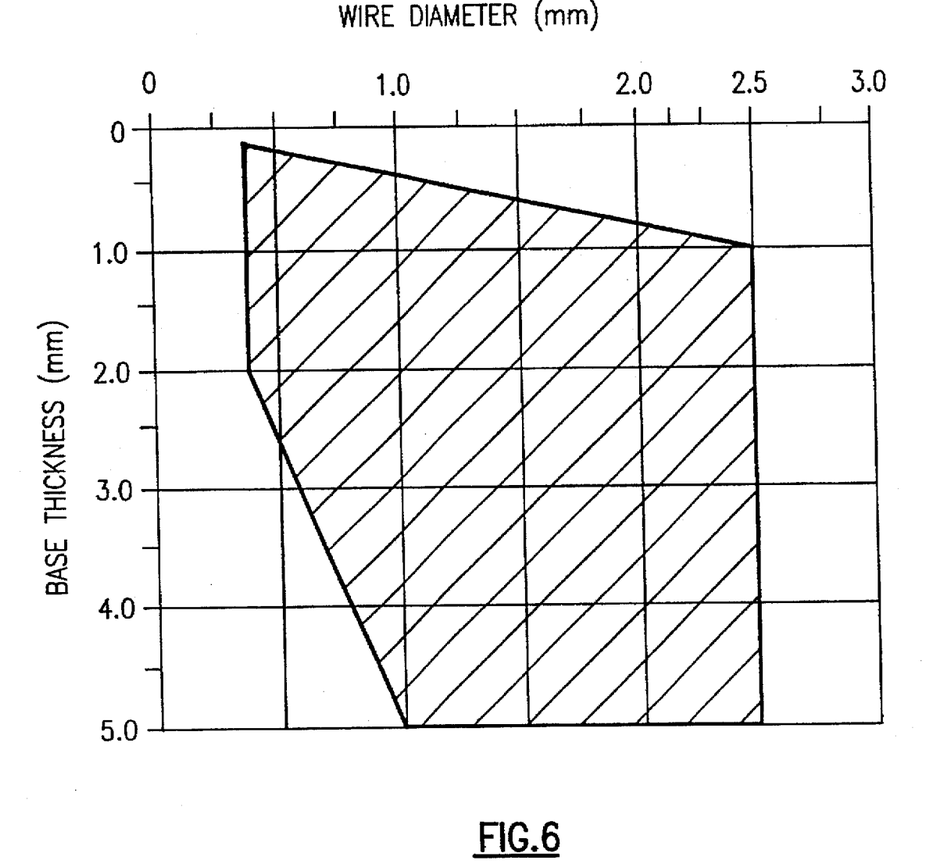
FIG. 6. is a graph of thermally conductive base thicknesses versus corrugated wound wire diameters, showing a preferred range (in hatched view) of these parameters with respect to the present invention.

In accordance with the teachings herein, the final design assures a product having predetermined (and preferred) ratios of wound wire (50) diameter D to base (51) thickness T. Because the base serves to spread heat from a device 30 to the wound wire elements 50, the base thickness is extremely important. For example, if a large thermal gradient exists across the heat sink, its performance is limited. If base 51 is too thick, melting of thermally conductive material 52 may be rendered difficult due to the base's large thermal mass. This mass can also be detrimental to device 30 during inertial loadings that occur during shipping and handling of an assembly or finished electronic package using the invention. FIG. 6 shows a preferred range of wound wire diameter D to base thickness T ratios, these falling within the hatched section of the graph.

While there have been shown and described what are at present considered the preferred embodiments of the invention, it will be obvious to those skilled in the art that various changes and modifications can be made therein without departing from the scope of the invention as defined by the appended claims. For example, it is readily possible to include two more opposing base members to form a four-sided structure with corrugated wound wire elements therein to form a ducted heat sink structure. Such added members could be located along the longer, opposite sides illustrated in FIG. 1, or, alternatively, along the opposing shorter sides. As mentioned, it is also readily possible to vary the spacing, height and/or wire diameter of the corrugated wound wire elements within a heat sink structure to form a multitude of configurations different from the differing height wire conductive element arrays depicted in FIGS. 1 and 2A.

What is claimed is:

1. A method of making a heat sink structure comprising the steps of:
   providing a heat-conducting base member having a plurality of lateral slots therein;
   forming a first substantially planar corrugated wound wire conductive element from a substantially singular wire;
   locating a substantially planar spacer member against said first wound wire heat conductive element;
   forming a second substantially planar corrugated wound wire heat conductive element from a substantially singular wire;
   positioning said second substantially planar corrugated wound wire heat conductive element against said substantially planar spacer member; and
   positioning both said first and second substantially planar corrugated wound wire heat conductive elements within said lateral slots within said heat-conducting base member in a thermally conductive manner.

2. The method of claim 1 wherein both said first and second substantially planar corrugated wound wire heat conductive elements are formed from the same singular continuous wire.

3. The method of claim 1 further including the step of removing said substantially planar spacer.

4. The method of claim 1 wherein said first and second substantially planar corrugated wound wire heat conductive elements are fixedly secured to said heat-conducting base member.

5. The method of claim 4 wherein said first and second planar corrugated wound wire heat conductive elements are fixedly secured by a process selected from the group consisting of brazing and soldering.

6. A method of making a heat sink structure comprising the steps of:
   providing a heat-conducting base member;
   forming a first substantially planar corrugated wound wire heat conductive element from a substantially singular wire;
   locating a substantially planar spacer member against said first wound wire heat conductive element;
   forming a second substantially planar corrugated wound wire heat conductive element from a substantially singular wire;
   positioning said second substantially planar corrugated wound wire heat conductive element against said substantially planar spacer member; and
   positioning both of said first and second substantially planar corrugated wound wire heat conductive elements on said heat-conducting base member in a thermally conductive manner, said method further including providing a plurality of spacedly positioned rodlike members and thereafter winding said substantially planar corrugated heat conductive elements about said rodlike members prior to said positioning of said heat conductive elements on said heat-conducting base member.

7. The method of claim 6 where said plurality of rodlike members occupy at least two spaced apart arrays of said members.

8. The method of claim 7 wherein each of said arrays are in a substantially planar configuration.

9. The method of claim 7 wherein said spaced apart arrays of said rodlike members are maintained in said spaced apart orientation positioning said rodlike members on a spacing element.

10. The method of claim 9 further including providing a plurality of end slots in said spacing element and thereafter positioning said rodlike members in respective ones of said end slots.

11. The method of claim 1 further including the step of positioning a second heat-conducting member on said first and second substantially planar corrugated wound wire heat conductive elements positioned on the other of said heat-conducting members.

12. The method of claim 1 where said substantially planar corrugated wound wire heat conductive elements are formed of wire having a diameter within the range of about 0.4 to about 2.5 mm.

13. A method of making a heat sink structure comprising steps of:
providing a heat-conducting base member having a plurality of individual wire receiving means therein;
forming a first substantially planar corrugated wound wire heat conductive element from a substantially singular wire;
forming a second substantially planar corrugated wound wire heat conductive element from a substantially singular wire; and
positioning said first and second substantially planar corrugated wound wire heat conductive elements within respective ones of said wire receiving means in said heat-conducting base member in a thermally conductive manner.

14. The method of claim 13 wherein both said first and second substantially planar corrugated wound wire heat conductive elements are formed from the same singular continuous wire.

15. The method of claim 13 including the step of providing a plurality of parallel slots within said heat-conducting base member, said parallel slots comprising said wire receiving means.

16. The method of claim 13 further including fixedly securing said first and second substantially planar corrugated wound wire heat conductive elements within said respective ones of said wire receiving means in said heat-conducting base member.

17. The method of claim 16 wherein said first and second substantially planar corrugated wound wire heat conductive elements are fixedly secured by a process selected from the group consisting of brazing and soldering.

18. The method of claim 13 further including providing a plurality of spacedly positioned rodlike members and thereafter winding said substantially planar corrugated heat conductive elements about said rodlike members.

19. The method of claim 18 where said plurality of rodlike members occupy at least two spaced apart arrays of said members.

20. The method of claim 19 wherein each of said arrays are of a substantially planar configuration.

21. The method of claim 20 wherein said spaced apart arrays of said rodlike members are maintained in said spaced apart orientation by positioning said rodlike members on a spacing element.

22. The method of claim 21 further including providing a plurality of slots in said spacing element and thereafter positioning said rodlike members in respective ones of said slots.

23. The method of claim 13 further including the step of positioning a second heat-conducting member on said first and second substantially planar corrugated wound wire heat conductive elements positioned on said first heat-conducting base member.

24. The method of claim 13 where said substantially planar corrugated wound wire heat elements are formed of wire having a diameter within the range of about 0.4 to about 2.5 mm.

25. A method of making a heat sink structure comprising the steps of:
providing a plurality of spacedly positioned rodlike members;
forming a first substantially planar corrugated wound wire conductive element from a substantially singular wire;
locating at least one substantially planar heat conductive spacer member against said first wound wire heat conductive element in a thermally conductive manner;
forming a second substantially planar corrugated wound wire heat conductive element from a substantially singular wire, said first and second wire heat conductive elements being wound about said spacedly positioned rodlike members during said forming thereof; and
positioning said second substantially planar corrugated wound wire heat conductive element against said substantially planar spacer member in a thermally conductive manner.

26. The method of claim 25 wherein both said first and second substantially planar corrugated wound wire heat conductive elements are formed from the same singular continuous wire.

27. The method of claim 25 wherein said first and second substantially planar corrugated wound wire heat conductive elements are fixedly secured to said heat-conducting spacer member.

28. The method of claim 27 wherein said first and second substantially planar corrugated wound wire heat conductive elements are fixedly secured to said heat-conducting spacer member by a process selected from the group consisting of brazing and soldering.

29. The method of claim 25 where said plurality of rodlike members occupy at least two spaced apart arrays of said members.

30. The method of claim 29 wherein each of said arrays are of a substantially planar configuration.

31. The method of claim 30 wherein said spaced apart arrays of said rodlike members are maintained in said spaced apart orientation by positioning said rodlike members within a spacing element.

32. The method of claim 25 where said substantially planar corrugated wound wire heat conductive elements are formed of wire having a diameter within the range of about 0.4 to about 2.5 mm.

33. A heat sink structure comprising:
a heat-conducting base member including a plurality of substantially parallel slots therein;
a plurality of substantially planar corrugated wound wire heat conductive elements each formed from a substantially singular continuous wire;
selected ones of said heat conductive elements being positioned in a side-by-side, substantially parallel, spaced-apart relationship so as to permit fluid flow through said elements in at least two different directions, said selected ones of said heat conductive elements including a series of curved end portions positioned within said slots within said base member in a thermally conductive manner.

34. The heat sink of claim 33 wherein said selected ones of said substantially planar corrugated wound wire heat conductive elements are formed from the same singular continuous wire.

35. The heat sink of claim 33 wherein said selected ones of said substantially planar corrugated wound wire heat conductive elements are fixedly secured within said slots within said heat-conducting base member.

36. The heat sink of claim 33 further including a second heat-conducting member positioned on said substantially planar corrugated wound wire heat conductive elements positioned within said slots within said first heat-conducting member.

37. The heat sink of claim 33 wherein said substantially corrugated wound wire heat conductive elements each include a diameter within the range of from about 0.4 to about 2.5 mm.

38. The heat sink of claim 33 wherein said heat-conducting base member has a thickness within the range of from about 1.0 to about 5.0 mm.

39. The heat sink of claim 33 wherein said heat-conducting base member includes a predetermined thickness of from about 0.4 to about 5.0 times the thickness of said wires.

40. The heat sink of claim 33 wherein said plurality of substantially planar corrugated wound wire heat conductive elements occupy a height from said base member within the range of from about five to about one-hundred times the thickness of said wires.

41. A heat sink comprising:
a plurality of spacedly positioned rodlike members;
a plurality of substantially planar corrugated wound wire heat conductive elements each formed from a substantially singular continuous wire, said heat conductive elements being wound about said rodlike members and positioned in a side-by-side, substantially parallel, spaced-apart relationship so as to permit fluid flow through said elements in at least two different directions;
at least one substantially planar thermally conductive spacer for providing said spacing between respective pairs of said heat conductive elements;
selected ones of said wound wire heat conductive elements each including a series of curved end portions positioned against said substantially planar thermally conductive spacer in a thermally conductive manner.

42. The heat sink of claim 41 wherein said selected ones of said substantially planar corrugated wound wire conductive elements are formed from the same singular continuous wire.

43. The heat sink of claim 41 wherein respective pairs of said substantially planar corrugated wound wire heat conductive elements are fixedly secured to respective ones of said thermally conductive spacer.

44. The heat sink of claim 41 wherein said substantially planar corrugated wound wire heat conductive elements are soldered to thermally conductive spacer.

45. The heat sink of claim 41 wherein said substantially planar corrugated wound wire heat conductive elements are brazed to said thermally conductive spacer.

46. The heat sink of claim 41 wherein said plurality of rodlike members occupy at least two spaced apart arrays of said members.

47. The heat sink of claim 46 wherein each of said arrays of said rodlike members are in a substantially planar configuration.

48. The heat sink of claim 41 wherein said substantially planar corrugated wound wire heat conductive elements each include a diameter within the range of from about 0.4 to about 2.5 mm.

49. The heat sink of claim 41 further including a heat-conducting base member, said wound wire heat conductive elements positioned on said base member in a thermally conductive manner, said heat-conducting base member having a thickness within the range of from about 1.0 to 5.0 mm.

50. The heat sink of claim 49 wherein said heat-conducting base member includes a predetermined thickness of from about 0.4 to about 5.0 times the thickness of said continuous, singular wire.

51. The heat sink of claim 41 wherein said plurality of substantially planar corrugated wound wire heat conductive elements occupy a height from said base member within the range of from about five to about one-hundred times the thickness of said wires.

52. An electronic apparatus comprising:
an electronic device having at least one substantially planar thermally conductive surface; and
a heat sink structure including a substantially planar heat conducting base member including a plurality of substantially parallel, spaced apart elongated grooves therein oriented in a first direction and a plurality of substantially parallel and spaced apart corrugated wound wire heat conductive elements thermally joined to said substantially planar heat conducting base member and oriented in a second direction substantially perpendicular to said first direction, selected ones of said wound wire heat conductive elements including a plurality of curved ends, each of said ends positioned within a respective one of said elongated grooves of said heat conducting base member, said electronic device being joined to said heat conducting base member of said heat sink structure in a thermally conductive manner along said substantially planar thermally conductive surface of said electronic device.

53. The apparatus of claim 52 wherein said electronic device is joined to said heat conducting base member with a thermally conductive adhesive.

54. The apparatus of claim 53 wherein said thermally conductive adhesive forms a layer between said substantially planar thermally conductive surface of said electronic device and said substantially planar heat conductive base member, said layer of adhesive possessing thermal conductivities ranging from about 0.5 Watts per meter-Kelvin to about 12 Watts per meter-Kelvin and possessing a thickness in the range of approximately 0.002 to 0.015 inches.

55. The apparatus of claim 52 wherein said corrugated wound wire heat conductive elements are wound in such a manner so as to have substantially a density of from about 0.155 to 1.6 wire per square millimeter of said substantially planar heat conductive surface area of said heat conducting member.

56. The apparatus of claim 52 wherein said corrugated wound wire heat conductive elements are wound in such a manner so as to possess an element height to element thickness ratio of about 5:1 to about 100:1.

57. An electronic apparatus comprising:
an electronic device having at least one substantially planar thermally conductive surface; and
a heat sink structure including a substantially planar heat conducting base member including a plurality of substantially parallel, spaced apart elongated grooves therein oriented in a first direction and a plurality of substantially parallel and spaced apart corrugated wound wire heat conductive elements and at least one heat conducting spacer member, said wound wire conductive elements thermally joined to said base member and said heat conducting spacer member and oriented in a second direction substantially perpendicular to said first direction, selected ones of said wound wire heat conductive elements including a plurality of curved ends, each of said ends positioned within a respective one of said elongated grooves of said heat conducting base member, said electronic device being joined to said wound wire heat conductive elements and said heat conducting spacer member in a thermally conductive manner along said electronic device.

58. The apparatus of claim 57 wherein said electronic is joined to said heat conducting base member with a thermally conductive adhesive.

59. The apparatus of claim 58 wherein said thermally conductive adhesive forms a layer between said substantially planar thermally conductive surface of said electronic device and said wound wire conductive elements and said heat conducting spacer member, said layer of adhesive possessing thermal conductivities ranging from about 0.5 watts per meter-Kelvin to about 12 watts per meter-Kelvin and possessing a thickness in the range of approximately 0.002 to 0.015 inches.

60. The apparatus of claim 57 wherein said corrugated wound wire heat conductive elements are wound in such a manner so as to have substantially a density of from about 0.155 to 1.6 wire per square millimeter of said substantially planar heat conductive surface area of said heat conducting member.

61. The apparatus of claim 57 wherein said corrugated wound wire heat conductive elements are wound in such a manner so as to possess an element height to element thickness ratio of about 5:1 to about 100:1.

* * * * *